United States Patent [19]

Masuda et al.

[11] 4,132,997
[45] Jan. 2, 1979

[54] MOS TYPE FIELD EFFECT TRANSISTOR

[75] Inventors: Hiroo Masuda, Kokubunji; Masaharu Kubo, Hachioji; Ryoichi Hori, Tokyo, all of Japan

[73] Assignee: Hitachi, Ltd., Japan

[21] Appl. No.: 764,428

[22] Filed: Jan. 31, 1977

[30] Foreign Application Priority Data

Jan. 30, 1976 [JP] Japan .................................. 51-8476

[51] Int. Cl.² .......................................... H01L 29/78
[52] U.S. Cl. ...................................... 357/23; 357/52
[58] Field of Search ................................ 357/23, 52

[56] References Cited

U.S. PATENT DOCUMENTS 4,027,321   5/1977   Collins et al. ........................ 357/23

Primary Examiner—Edward J. Wojciechowicz
Attorney, Agent, or Firm—Craig & Antonelli

[57] ABSTRACT

A MOS type field effect transistor has an electrode, which is in the neighborhood of, but not in contact with, the drain diffusion region and is electrically connected with the surface portion of the semiconductor substrate in which the MOS type field effect transistor is formed, and whose potential is held at the rear surface potential of the semiconductor substrate, i. e., the substrate bias potential.

5 Claims, 4 Drawing Figures

MOS TYPE FIELD EFFECT TRANSISTOR

BACKGROUND OF THE INVENTION

1. Field of the Invention

The present invention relates to a MOS type field effect transistor having a high source-drain breakdown voltage.

2. Description of the Prior Art

A conventional MOS type field effect transistor consists of source and drain diffusion regions disposed in a surface portion of a semiconductor substrate, an insulating layer formed on the surface of the semiconductor substrate outside the region where the MOS type field effect transistor is formed, a gate oxide layer covering the surface of the semiconductor substrate between the source and the drain diffusion regions, a gate electrode disposed on the gate oxide layer, a source electrode and a drain electrode. The drain breakdown voltage is one of the most important characteristics of the MOS type field effect transistor, because it determines the power supply voltage for the entire circuit. For a conventional MOS type field effect transistor described above, ordinarily, the breakdown voltage between the drain and the source is about one half of that between the drain and the semiconductor substrate. Further, both characteristics vary with variations in the gate voltage. It is presumed that this is due to the fact that the source, the semiconductor substrate and the drain constitute a parasitic npn lateral bipolar transistor, in which they are the emitter, the base, and the collector, respectively, if the MOS type field effect transistor is of n channel type. Under normal working conditions, the collector junction of this parasitic transistor is reverse-biased. When the reverse-bias applied to the collector junction increases, electrons present in the base are accelerated by a strong electric field at the collector junction, and it turns out that electron-hole pairs are generated in the base before breakdown by electron avalanche at the collector junction. From these electron-hole pairs, electrons are immediately absorbed by the collector which is at a positive potential. But, since holes are not absorbed by the collector, if the base is open, i.e., if the base potential is not well determined, the holes increase the base potential near the emitter, which finally results in electron injection from the emitter to the base. The majority of these injected electrons reach the collector junction through the base just as in ordinary transistors, accelerated by the strong electric field at the collector junction, and rush to the collector. That is, the abrupt increase of the reverse current, i.e., breakdown at the collector junction is provoked by holes of electron-hole pairs generated in the base before real breakdown due to electron avalanche. In simple diode junctions, which are not transistors, the abrupt increase of the reverse current does not occur until electron avalanche is produced. It is well known that, denoting the breakdown voltage between the collector and the emitter of a transistor by $BV_{CE}$, the breakdown voltage between the collector and the base by $BV_{CB}$, and the current amplification factor of the transistor by $h_{FE}$, when the base is open, $BV_{CE}$ can be represented by the following relation:

$$BV_{CE} \doteq BV_{CB}/\sqrt{h_{FE}} \qquad (1)$$

Since the base resistance between an electrode disposed on the rear surface of the semiconductor substrate giving a substrate bias voltage to the transistor and the drain of the MOS type field effect transistor, described previously, is as high as about 3kΩ, the base of the parasitic lateral transistor mentioned above can be nearly considered to be in a base open state. Consequently, the formula (1) can be applied to a parasitic lateral transistor, whose emitter, base, and collector are the source, the substrate, and the drain, respectively, and transformed to $$BV_{DS} \doteq BV_j/\sqrt{h_{FE}} \qquad (2)$$

where $BV_j$ and $BV_{DS}$ represent the source-drain breakdown voltage and the drain-substrate breakdown voltage of the MOS type field effect transistor, respectively. This is the reason why $BV_{DS}$ is much smaller than $BV_j$ for conventional MOS type field effect transistors for the gate voltages above a certain value, for which $h_{FE}$ is substantially greater than unity.

SUMMARY OF THE INVENTION

An object of the invention is, therefore, to remove this drawback of conventional MOS type field effect transistors and to provide a new MOS type field effect transistor having a high source-drain breakdown voltage.

In order to achieve this object, the MOS type field effect transistor according to the invention has an electrode which is in the neighborhood of, but not in contact with, the drain diffusion region and is electrically connected with the surface portion of the semiconductor substrate in which the MOS type field effect transistor is formed, and whose potential is held at the rear surface potential of the semiconductor substrate, i.e., the substrate bias potential. That is, taking into account the fact that decrease of the source-drain breakdown voltage of a MOS type field effect transistor is provoked by holes of electron-hole pairs produced in the base before a real brakdown of the collector junction of the parasitic lateral transistor due to electron avalanche, an electrode is disposed in the neighborhood of the drain, where the electrode does not disturb the channel on the surface of the semiconductor substrate, so that the electrode rapidly absorbs holes of electron-hole paris produced by small current in the semiconductor substrate corresponding to the base of the parasitic lateral transistor prior to the real breakdown due to electron avalanche. Otherwise, holes would flow through a resistance as high as 3kΩ to the rear surface of the semiconductor substrate.

The invention will be explained in more detail in conjunction with some preferred embodiments, but it is, of course, understood that various modifications and changes can be made without departing from the spirit of the invention.

EMBODIMENT 1

Figure 1:
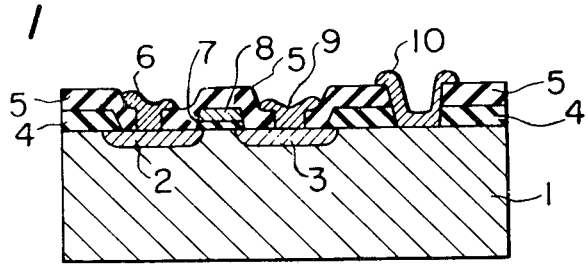
FIG. 1 is a sectional view of a MOS type field effect transistor according to the invention.

FIG. 1 shows an example of an n-channel Si gate MOS type field effect transistor according to the invention. A P type conductivity Si substrate 1 about 200 μm thick, having a specific resistivity of 4Ω.cm, whose surface portion is doped with boron impurities to an impurity concentration level of about $10^{16}$ cm$^{-3}$ for device isolation, so that the sheet resistance at the surface is about 1kΩ/□, is covered with a first SiO$_2$ layer 4 about 1μm thick for isolation, except for a region, where an MOS type field effect transistor is to be formed. The last mentioned region is covered with a gate oxide layer 7, 500Å thick. A gate 8 made of a polycrystalline silicon layer about 2μm wide and about 3000 Å thick is deposited on a predetermined area of the gate oxide layer 7. Two n$^+$ conductivity type diffusion regions about 0.4 μm thick and 8μm wide, which are a source 2 and a drain 3, are formed by self-alignment by diffusing arsenic using the polycrystalline silicon layer 8 as a diffusion mask. After having deposited a second SiO$_2$ layer 5 about 0.6μm thick on the entire surface, holes for the source electrode 6, the drain electrode 9 and an electrode 10 according to the invention (hereinbelow called a base electrode) are formed in the first and second SiO$_2$ layers 4,5. Next, an Al layer is deposited on the entire surface and etched off so as to form the source electrode 6, the drain electrode 9 and the base electrode 10. The base electrode 10 is so deposed that the drain and the base electrode are parallel and the distance therebetween is about 2μm. This distance, is, of course, as small as possible. However, since the base electrode is never in contact with the drain, the nominal distance should be 2μm in the present level of the photoetching techniques. For this geometry, the resistance between the channel region and the base electrode is about 0.5kΩ per width of 10μm measured in the longitudinal direction of the base electrode, while the corresponding resistance between the channel region and the rear surface of the substrate is about 3kΩ. The effect of the invention decreases, of course, with increasing distance between the channel region and the base electrode, and the resistance between them is equal to 3kΩ, when the distance is about 30μm. Above this distance, the effect of the invention cannot be expected.

The base electrode is maintained at the potential which is applied to the rear surface of conventional MOS type field effect transistors. Since the resistance between this electrode and the channel region is very small, it can rapidly absorb holes, which otherwise decreases BV$_{DS}$. Consequently, a BV$_{DS}$ which is very close to BVj can be obtained.

It should be noted that the effect of the invention can be achieved also by using either a very thin semiconductor substrate, which is several microns thick, or a thin P conductivity type epitaxial layer grown on a thick P$^+$ conductivity type substrate. However, the former is not possible from a mechanical point of view, and the latter is expensive.

Figure 2:
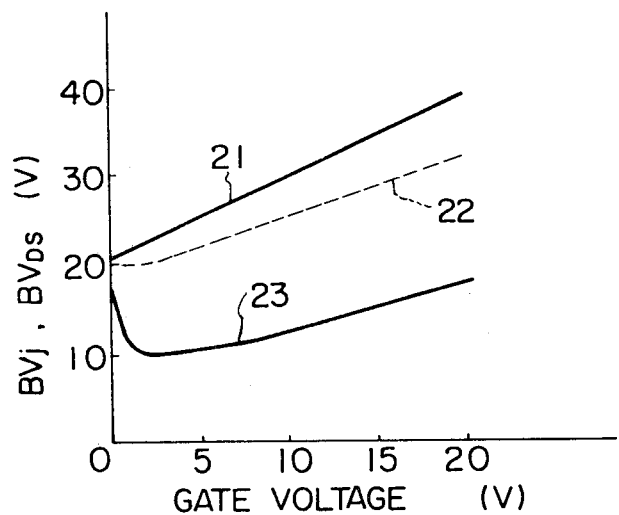
FIG. 2 is a diagram showing variations of the breakdown voltage between the drain and the source and the breakdown voltage between the drain and the substrate versus the gate voltage.

FIG. 2 shows variations of BVj 21, BV$_{DS}$, where the base electrode 10 is held at a potential of −2V, 22 and BV$_{DS}$, and where the rear surface electrode of a conventional corresponding MOS type field effect transistor is held at the same potential, 23 versus the gate voltage. These curves verify the relation represented by the formula (2) and, at the same time, show clearly the advantage of the invention.

EMBODIMENT 2

Figure 3:
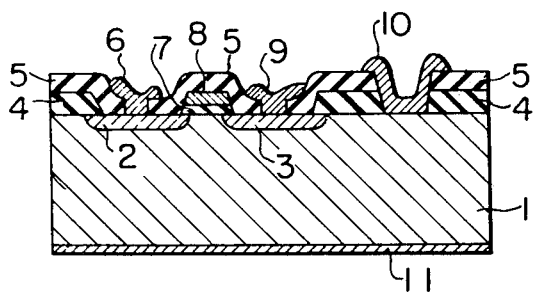
FIGS. 3 and 4 are sectional views of other MOS type field effect transistors according to the invention.

The MOS type field effect transistor according to the invention can be integrated in large scale semiconductor circuits. Almost all these circuits are provided with a rear surface electrode 11 held at the substrate bias potential, as shown in FIG. 3. In this case, denoting the potential of the rear surface electrode 11, that of the base electrode 10 and that of the source electrode 6, which, in case different source potentials are applied to a plurality of sources disposed on a same chip, is the lowest, by V$_{SUB}$, V$_{10}$, and V$_S$, respectively, the following condition must be fulfilled, only for the purpose of the absorption of holes produced in the base.

$$V_{SUB} \leq V_{10} \leq V_S \qquad (3)$$

However, if V$_{SUB}$ < V$_{10}$, current flows steadily from the base electrode 10 to the rear surface electrode 11 and gives rise to power loss and temperature rise. Therefore, it is preferable to hold V$_{10}$ at V$_{SUB}$. Further, all the MOS type field effect transistors formed in one chip need not be provided with the base electrode according to the invention, but only those which must have a high source-drain breakdown voltage are provided with it.

EMBODIMENT 3

Figure 4:
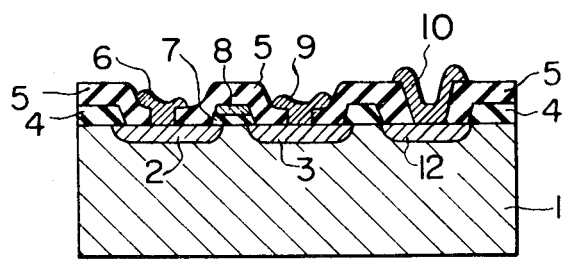

FIG. 4 represents a sectional view of another example of the invention, in which like reference numerals designate like parts of FIG. 1. In this embodiment, the base electrode 10 is connected to the semiconductor substrate 1 through a diffusion layer 12 doped with an impurity of the same conductivity type as that of the source and drain regions. This example has the same functions as those indicated in the preceeding Embodiments, but it is more advantageous, because it can be fabricated by a fabrication process in which one photoetching process for making the hole for the base electrode can be omitted with respect to that indicated in Embodiment 1. Furthermore, even if V$_{10}$ is higher than V$_{SUB}$, no current flows from the base electrode to the rear surface electrode.

In the above Embodiments, the present invention was explained for n channel MOS type field effect transistors. But it is apparent that the present invention can be equally well applied to p channel MOS type field effect transistors, if the conductivity type of all the regions and the signes of inequality are reversed.

As explained above, according to the invention, a high source-drain breakdown voltage MOS type field effect transistor can be obtained by a simple modification of a conventional type MOS transistor.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:
1. A MOS type field effect transistor comprising:
   a semiconductor substrate of a first conductivity type;
   a source region and a drain region of a second conductivity type, which is opposite to said first con- ductivity type, disposed in a surface portion of said semiconductor substrate;

a gate insulation layer convering the surface portion between said source region and said drain region;

a gate disposed on said gate insulation layer;

a source electrode and a drain electrode disposed on said source region and said drain region, respectively;

a rear surface electrode which is disposed on the other surface of said semiconductor substrate, and whose potential is held at a value so that the junction formed between said source and said surface portion of said semiconductor substrate is reverse-biased;

a base electrode which is disposed adjacent to, but not in contact with, said drain region at the other side of said source region with respect to said drain region and electrically connected with the surface portion of said semiconductor substrate, and whose potential is held at a value between that of the source and that of said rear surface electrode including the latter, the resistance between the surface portion covered by said gate oxide layer and said base electrode being smaller than the resistance between the surface portion covered by said gate insulation layer and the rear surface of said semiconductor substrate; and an insulating layer covering said surface portion of said semiconductor substrate except for said source electrode, said gate, and said drain electrode, and said base electrode.

2. A MOS type field effect transistor according to claim 1, further comprising a semiconductor region doped with an impurity of said second conductivity type in the surface portion of said semiconductor substrate which is in contact with said base electrode.

3. A MOS type field effect transistor according to claim 1, wherein said rear surface electrode is held at the same potential as said base electrode.

4. A MOS type field effect transistor according to claim 1, wherein said base electrode and said drain electrode are parallel to each other.

5. A MOS type field effect transistor according to claim 4, wherein said semiconductor substrate is made of silicon and the distance between said drain electrode and said base electrode is between 2 and 30$\mu$m.

* * * * *